(12) United States Patent
Kwak

(10) Patent No.: US 8,049,412 B2
(45) Date of Patent: Nov. 1, 2011

(54) ORGANIC LIGHT EMITTING DISPLAY DEVICE

(75) Inventor: Won-Kyu Kwak, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 166 days.

(21) Appl. No.: 12/368,609

(22) Filed: Feb. 10, 2009

(65) Prior Publication Data

US 2009/0218925 A1 Sep. 3, 2009

(30) Foreign Application Priority Data

Feb. 28, 2008 (KR) ........................ 10-2008-0018312

(51) Int. Cl.
*H01L 51/50* (2006.01)
(52) U.S. Cl. ................... 313/504; 428/690; 313/512
(58) Field of Classification Search .............. 313/504, 313/509, 512, 495; 428/690
See application file for complete search history.

(56) References Cited

U.S. PATENT DOCUMENTS

| 6,239,854 | B1 | 5/2001 | Hirakata et al. |
| 7,671,532 | B2 * | 3/2010 | Kim .................. 313/509 |
| 2007/0247807 | A1 | 10/2007 | Kondo et al. |

FOREIGN PATENT DOCUMENTS

| CN | 1577413 A | 2/2005 |
| EP | 1 511 081 A2 | 3/2005 |
| EP | 1 503 422 A3 | 8/2006 |
| JP | 10-096940 | 4/1998 |
| JP | 11-109385 | 4/1999 |
| JP | 2002-198186 | 7/2002 |
| JP | 2005-049808 | 2/2005 |
| JP | 2005-108824 | 4/2005 |
| JP | 2005-197202 | 7/2005 |
| JP | 2007-171440 | 7/2007 |
| JP | 2007-234979 | 9/2007 |
| KR | 10-2007-0006604 | 1/2007 |

OTHER PUBLICATIONS

SIPO Office action dated Apr. 14, 2010, for corresponding Chinese Patent application 200910118058.5, with English translation, noting listed reference in this IDS.
European Search Report dated Jun. 24, 2009, for corresponding European application 09250595.7, noting listed references in this IDS.
Japanese Patent Office Action dated Feb. 8, 2011 in corresponding Japanese patent application No. JP 2008-151620, 2 pps.

* cited by examiner

*Primary Examiner* — Nimeshkumar Patel
*Assistant Examiner* — Mary Ellen Bowman
(74) *Attorney, Agent, or Firm* — Christie, Parker & Hale, LLP

(57) ABSTRACT

An organic light emitting display device. The organic light emitting display device includes a first substrate, a second substrate overlapping with at least one region of the first substrate and a sealing agent attached between the first substrate and the second substrate to seal a display unit therebetween. A conductive wire on the first substrate overlapping with at least a portion of the sealing agent includes a first conductive layer and a second conductive layer having at least one region formed at different levels to be electrically coupled to each other through contact holes. The first conductive layer and the second conductive layer are configured to reduce a resistance of the conductive wire and improve an adhesive force of the sealing agent.

13 Claims, 6 Drawing Sheets

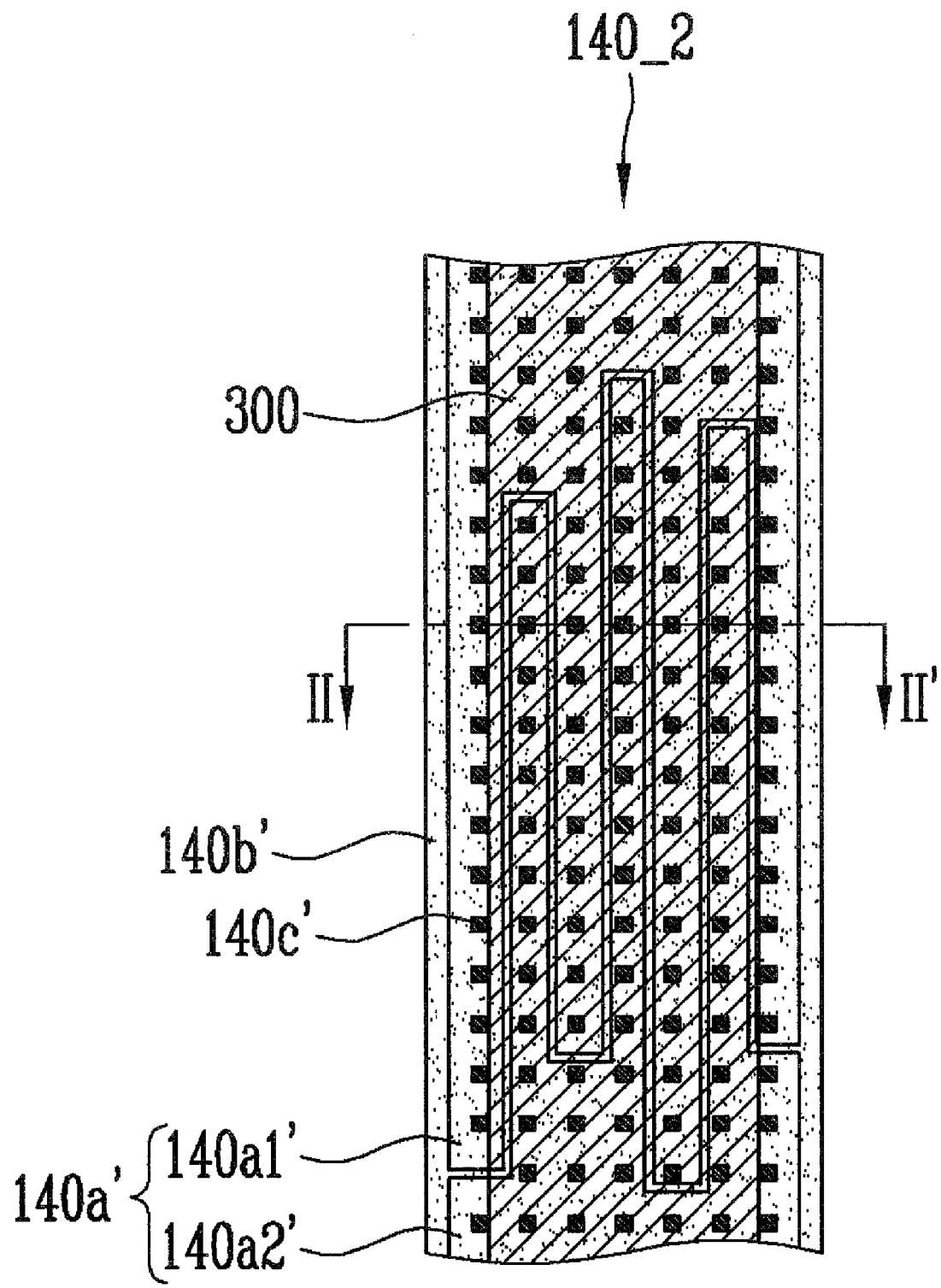

$140a'\begin{cases}140a1'\\140a2'\end{cases}$

140b'
140c'

ORGANIC LIGHT EMITTING DISPLAY DEVICE

CROSS-REFERENCE TO RELATED APPLICATION

This application claims priority to and the benefit of Korean Patent Application No. 10-2008-0018312, filed on Feb. 28, 2008, in the Korean Intellectual Property Office, the entire content of which is incorporated herein by reference.

BACKGROUND OF THE INVENTION

1. Field of the Invention

The present invention relates to an organic light emitting display device, and more particularly, to a conductive wire and a sealing agent of an organic light emitting display device.

2. Description of Related Art

In recent years, there have been developed various flat panel displays that are light-weight and small-sized as compared with cathode ray tubes. Among the flat panel display devices, the organic light emitting display device has excellent luminance and color purity by using an organic compound as a light emitting material.

An organic light emitting display device includes a display unit including a large number of pixels disposed at crossing regions between scan lines and data lines, and a drive circuit for driving the display unit.

Here, each of the pixels includes an organic light emitting diode, each of which includes an anode electrode, a cathode electrode and an organic light emitting layer formed therebetween.

Since the organic light emitting layer deteriorate when exposed to moisture and oxygen, the display unit of the organic light emitting display device is generally sealed with an encapsulation member. That is to say, a display panel of an organic light emitting display device in which the display unit is formed includes a first substrate having the display unit formed thereon and a second substrate attached to the first substrate by a sealing agent for sealing the display unit. Further, a pad unit for receiving power from drive power sources and/or drive signals from an outside source is formed on one side of the first substrate.

In the organic light emitting display device, conductive wires for supplying power from drive power sources and/or drive signals to the display unit are formed between the display unit and the drive circuit, and/or between the display unit and the pad unit.

For example, scan lines and/or data lines for supplying a scan signal and/or a data signal may be formed between the display unit and the drive circuit. Power lines for supplying power from first and second power sources (ELVDD and ELVSS) to the display unit may be formed between the display unit and the pad unit.

However, when the power and/or the drive signals are transmitted through conductive wires, a voltage drop (IR drop) occurs due to the resistance of the conductive wires. Therefore, the characteristics of the organic light emitting display device may be deteriorated, such that non-uniform image quality may result, for example.

For example, when the power sources (ELVDD and ELVSS) supply a DC type power through the conductive wires, a relatively high voltage drop may occur along the conductive wires. Therefore, the pixels may be supplied with various voltages from the power sources (ELVDD and ELVSS), which leads to non-uniform image quality.

In some display panels, at least some of the conductive wires may be disposed to be overlapped with a sealing agent so as to reduce a dead space and the like.

Here, an adhesive force of the sealing agent may be changed according to the characteristics of materials used as the sealing agent and the configuration of the conductive wires disposed at a lower portion of the sealing agent. Therefore, it is desirable to improve reliability of the organic light emitting display device by configuring the conductive wires so as to provide a uniform adhesive force of the sealing agent.

SUMMARY OF THE INVENTION

Embodiments of the present invention provide an organic light emitting display device having reduced resistance of a conductive wire and an improved uniform adhesive force of a sealing agent.

According to an embodiment of the present invention, an organic light emitting display device includes a first substrate having a display unit on one surface thereof; a second substrate and overlapping with at least one region of the first substrate including the display unit; a sealing agent attached between the first substrate and the second substrate for sealing the display unit; and a conductive wire on the first substrate overlapping with at least a portion of the sealing agent and including a first conductive layer and a second conductive layer, at least one region of the first conductive layer and at least one region of the second conductive layer formed at different levels and electrically coupled to each other through contact holes. The first conductive layer includes a first region and a second region that are physically disconnected from each other, and an interface between the first region and the second region has a concavo-convex shape.

The interface between the first region and the second region of the first conductive layer may have upper straight sections extending in a first direction and lower straight sections extending in the first direction. The upper straight sections and the lower straight sections respectively form a crisscross pattern.

Also, the contact holes may be uniformly distributed throughout a region where the first conductive layer and the second conductive layer overlap with each other.

In addition, the first conductive layer may include a gate metal, the second conductive layer may include a source/drain metal, and a gate insulating layer may be between the first conductive layer and the second conductive layer.

Additionally the second conductive layer may include a continuous region, and the first region and the second region of the first conductive layer may be electrically coupled to each other through the second conductive layer and the contact holes.

Also, the conductive wire may include a power line for supplying power of a power source to the display unit.

Furthermore, the contact holes may be uniformly distributed in a lower portion of the second conductive layer.

According to another embodiment of the present invention, an organic light emitting display device includes a first substrate having a display unit on one surface thereof; a second substrate overlapping with at least one region of the first substrate including the display unit; a sealing agent attached between the first substrate and the second substrate for sealing the display unit; and a conductive wire on the first substrate and overlapped with at least a portion of the sealing agent. The conductive wire includes a conductive layer on an insulating film having a plurality of contact holes formed therein.

Here, the plurality of contact holes may be uniformly distributed over a lower portion of the conductive layer.

According to still another embodiment of the present invention, an organic light emitting display device includes a first substrate having a display unit on one surface thereof; a second substrate overlapping with at least one region of the first substrate including the display unit; a sealing agent attached between the first substrate and the second substrate for sealing the display unit; and a conductive wire on the first substrate overlapping with at least a portion of the sealing agent and including a first conductive layer and a second conductive layer, at least one region of the first conductive layer and at least one region of the second conductive layer formed at different levels and electrically coupled to each other through contact holes. The first conductive layer includes a first region and a second region that are physically disconnected from each other at a first end of the first region and a second end of the second region, and the first end and the second end each include protrusion units and receiving units.

As described above, the organic light emitting display device according to the embodiments of the present invention may reduce resistance of a conductive wire by forming a laminated structure of conductive wires that is composed of at least two conductive layers (e.g., first and second conductive layers). Therefore, it may reduce the voltage drop a drive power source and/or a drive signal supplied via the conductive wire. In addition, it may display an image with improved uniform image quality.

Also, the organic light emitting display device according to the embodiments of the present invention may prevent an antenna effect by physically disconnecting one region of the first conductive layer that includes a laminated structure of conductive wires. Also, the organic light emitting display device according to the embodiments of the present invention may provide a sealing agent that has a uniform adhesive force.

Furthermore, the organic light emitting display device according to the embodiments of the present invention may increase an adhesive force of the sealing agent uniformly by forming the contact holes uniformly distributed between the first and second conductive layers, or in a lower portion of the second conductive layer, thereby increasing a surface area of a film formed on the contact holes and a surface area of the sealing agent, and dispersing heat generated in a sealing process.

BRIEF DESCRIPTION OF THE DRAWINGS

The accompanying drawings, together with the specification, illustrate exemplary embodiments of the present invention, and, together with the description, serve to explain the principles of the present invention.

FIG. 4 is a plan view showing another embodiment of the first conductive wire shown in FIG. 1.

DETAILED DESCRIPTION OF EMBODIMENTS

Figure 1:
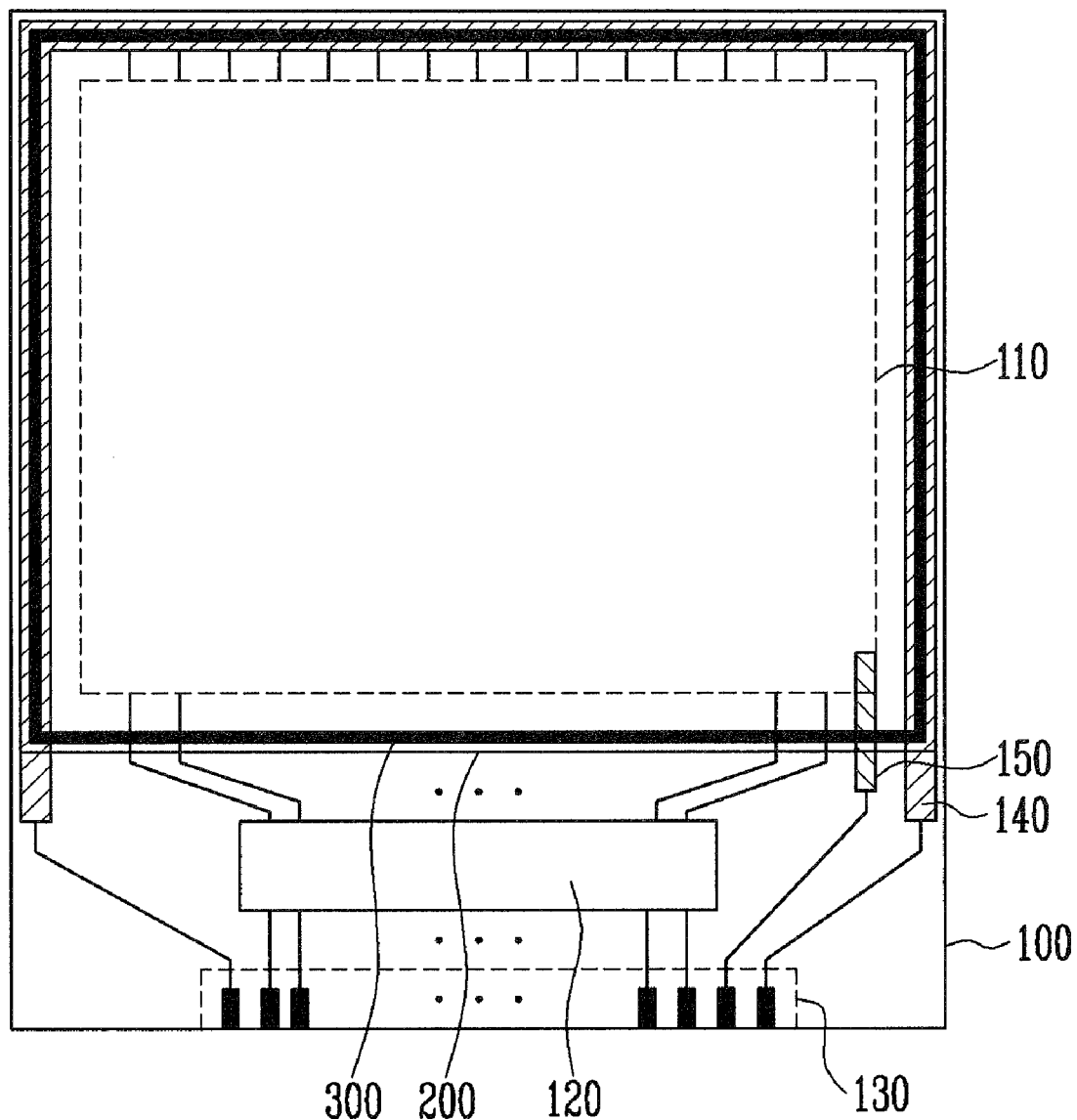
FIG. 1 is a plan view showing an organic light emitting display device according to an exemplary embodiment of the present invention.

Hereinafter, certain exemplary embodiments according to the present invention will be described with reference to the accompanying drawings. Here, when a first element is described as being coupled to a second element, the first element may be directly coupled to the second element or indirectly coupled to the second element via a third element. Further, some of the elements that are not essential to the complete understanding of the invention are omitted for clarity. Also, like reference numerals refer to like elements throughout.

FIG. 1 is a plan view showing an organic light emitting display device according to an exemplary embodiment of the present invention.

Referring to FIG. 1, the organic light emitting display device according to an exemplary embodiment of the present invention includes a first substrate 100 having a display unit 110, a drive circuit 120 and a pad unit 130 formed thereon; a second substrate 200 disposed on one region of the first substrate 100; and a sealing agent 300 attached between the first substrate 100 and the second substrate 200.

The display unit 110 is formed on one surface of the first substrate 100, and includes a plurality of pixels (not shown), each of which includes at least one organic light emitting diode. The display unit 110 displays an image corresponding to power from drive power sources and/or drive signals that are supplied from the drive circuit 120 and/or the pad unit 130.

The drive circuit 120 generates a scan signal and/or a data signal corresponding to the power from the drive power sources and/or the drive signals supplied from the pad unit 130, and supplies the generated scan signal and/or data signal to the display unit 110. The drive circuit 120 may include a scan driver and/or a data driver. The drive circuit 120 may be formed together with the display unit 110 in a process of forming the display unit 110, or may be mounted on the first substrate 100 in the form of an integrated circuit (IC) chip.

The pad unit 130 includes a plurality of pads to receive the power from the drive power sources and/or the drive signals from the outside source, and supply the power from the drive power sources and/or the drive signals to the display unit 110 and/or the drive circuit 120.

Here, the display unit 110 is disposed inside a sealing region between the first substrate 100 and the second substrate 200 that is sealed to the first substrate 100 by the sealing agent 300, and the drive circuit 120 and/or the pad unit 130 are disposed outside the sealing region.

The second substrate 200 is disposed on at least one region of the first substrate 100. Then, the second substrate 200 is sealed with the at least one region of the first substrate 100 using the sealing agent 300 to provide the sealing region that includes the display unit 110 therein.

The sealing agent 300 is applied on edges around a surface of the second substrate 200 facing the first substrate 100 to attach the first substrate 100 and the second substrate 200 to each other. That is, the sealing agent 300 is attached between the first and second substrates 100 and 200 to seal a region between (for example, the region where the display unit 110 is located) the first and second substrates 100 and 200.

Furthermore, conductive wires to supply the power from the drive power sources and/or the drive signals to the display unit 110 are formed between the display unit 110 and the drive circuit 120, and/or between the display unit 110 and the pad unit 130.

For example, scan lines and/or data lines for supplying a scan signal and/or a data signal may be formed between the display unit 110 and the drive circuit 120.

Also, first and second conductive wires 140 and 150 for supplying power from first and second power sources (ELVDD and ELVSS) from outside the organic light emitting display device to the display unit 110 may be formed between the display unit 110 and the pad unit 130.

However, when the first and second power sources (ELVDD and ELVSS) supply a DC type power, a voltage drop (IR drop) may occur along the conductive wires 140 and 150 due to the resistance of the conductive wires 140 and 150. Therefore, the conductive wires 140 and 150 may be formed relatively wider than the other signal lines.

Thus, in addition to the data signal, the power supplied from the power sources (ELVDD and ELVSS) may directly affect the luminance of the pixels. Therefore, the conductive wires 140 and 150 should be designed to minimize (or reduce) the voltage drop of power supplied from the power sources (ELVDD and ELVSS).

For convenience of description, detail description of the first conductive wire 140 for supplying power from a first power source (ELVDD) will be used as an illustrative example.

The first conductive wire 140 may be formed with a relatively large width, and also is disposed to surround the perimeter (e.g., on three sides) of the display unit 110.

At least a portion of the first conductive wire 140 is formed in a laminated structure that includes at least two conductive layers that are formed in different layers and are electrically coupled to each other through contact holes. As such, it is possible to minimize or reduce the voltage drop of the first power source (ELVDD) along the first conductive wire 140.

Also, the first conductive wire 140 may be so disposed such that a portion of the first conductive wire 140 overlaps the sealing agent 300 to minimize or reduce a dead space on the first substrate 100.

Here, the first and second conductive wires 140 and 150 for supplying the power from the first and second power sources (ELVDD and ELVSS) in the organic light emitting display device are shown FIG. 1, but the present invention is not particularly limited thereto.

For example, mother wires may be commonly coupled to organic light emitting display devices disposed in the same row and/or column on a mother substrate that has a large number of organic light emitting display devices formed therein. As described above, the mother wires, which supply the power from the power sources (ELVDD and ELVSS) to the organic light emitting display devices coupled to the mother wires, may be so disposed to overlap the sealing agent 300. That is, embodiments of the present invention may apply to the mother wires.

Figure 2:
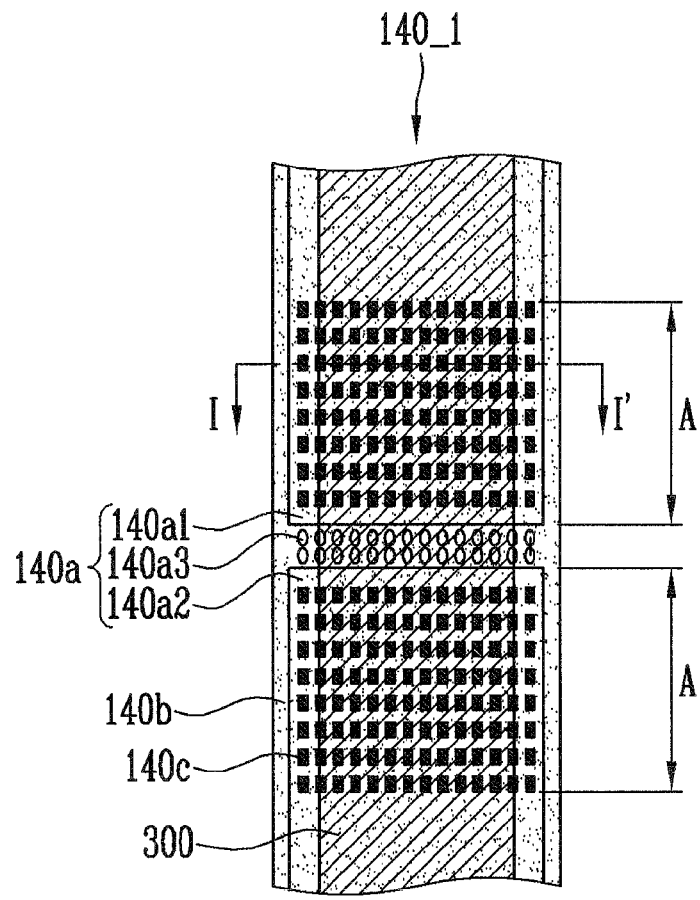
FIG. 2 is a plan view showing an example of a first conductive wire shown in FIG. 1.
Figure 3:
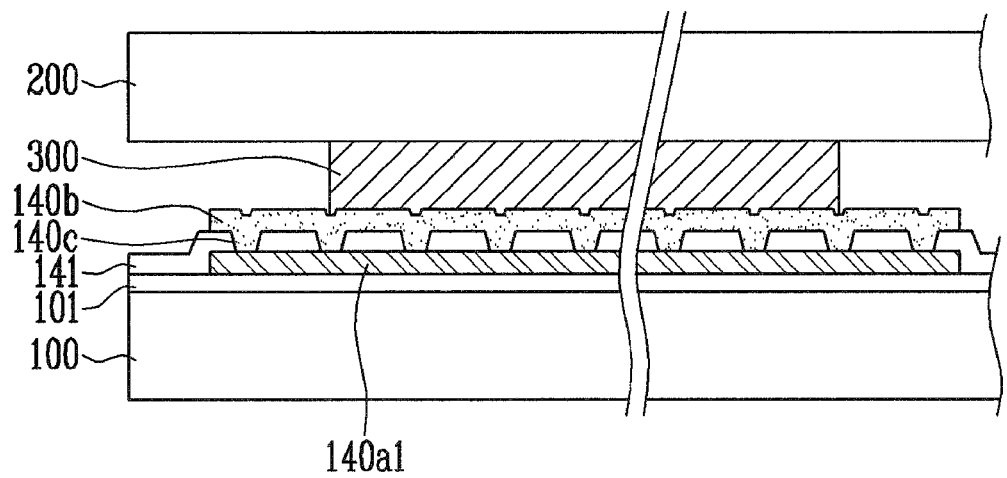
FIG. 3 is a cross-sectional view taken along the line I-I' in FIG. 2.

FIG. 2 is a plan view showing an example of the first conductive wire 140 as shown in FIG. 1, and FIG. 3 is a cross-sectional view taken along the line I-I' as shown in FIG. 2. For convenience of description, a substrate and an insulating film are not shown in FIG. 2.

Referring to FIGS. 2 and 3, at least one region 140_1 of the first conductive wire 140 is formed with a laminated structure that includes a first conductive layer 140a and a second conductive layer 140b.

In some embodiments, the at least one region 140_1 of the first conductive wire 140 may be formed in a laminated structure including the first conductive layer 140a and the second conductive layer 140b. Here, the first conductive layer 140a may be formed on the first substrate 100, and the second conductive layer 140b may be formed to overlap the first conductive layer 140a with an insulating film 141 interposed therebetween.

Here, the first conductive layer 140a may be formed on a buffer layer and/or a gate insulating film 101 formed on the substrate 100, and may be formed in the same process of forming a gate electrode of a thin film transistor in the display unit 110. That is to say, the first conductive layer 140a may be formed of a gate metal, for example, molybdenum (Mo), etc.

However, when the first conductive layer 140a is made of the gate metal such as molybdenum (Mo) and is extended for a certain length, it may bring about an antenna effect. Therefore, the first conductive layer 140a is designed not to be too long and to be discontinous at least at a portion thereof so as to prevent the antenna effect.

In other words, the first conductive layer 140a is made of the same conductive material and disposed in the same layer as the gate metal, wherein the at least one region 140_1 of the first conductive layer 140a includes first and second regions 140a1 and 140a2 that are physically disconnected to be spaced apart from each other.

Also, a first conductive layer 140a is disposed at a space between the first and second regions 140a1 and 140a2, i.e., between the first region 140a1 and the second region 140a2, the first conductive layer 140a being patterned into a pattern 140a3 having a predetermined shape. The pattern 140a3 does not supply power and/or a signal, but may relieve a stepped difference of layers that will be formed on the first conductive layer 140a.

An insulating film 141 such as an interlayer insulating film is formed on the first conductive layer 140a. A second conductive layer 140b is formed on the insulating film 141.

The second conductive layer 140b may be formed in the same process for forming the source/drain electrode of the thin film transistor in the display unit 110. That is, the second conductive layer 140b may be formed with a three-layered structure of a source/drain metal, for example, titanium/aluminum/titanium (Ti/Al/Ti).

Such a second conductive layer 140b is continuously formed, without physical disconnection in any region of the second conductive layer 140b, in a region in which the first conductive wire 140 is formed. The second conductive layer 140b is electrically coupled with the first conductive layer 140a through the contact holes 140c that are formed in a border region where the first conductive layer 140a is physically disconnected (region 'A' in FIG. 2).

That is, a plurality of contact holes 140c are formed in the insulating film 141 that is formed between the first conductive layer 140a and the second conductive layer 140b, thereby electrically coupling the first conductive layer 140a to the second conductive layer 140b via the contact holes 140c.

According to the above-mentioned configuration, the first and second regions 140a1 and 140a2 of the first conductive layer 140a maintains the electrical connection through the contact holes 140c and the second conductive layer 140b.

As described above, the at least one region 140_1 of the first conductive wire 140 may be formed in a laminated structure that includes the first conductive layer 140a and the second conductive layer 140b and has a relatively large width. Therefore, it is possible to reduce the resistance of the first conductive wire 140. As a result, it is also possible to minimize or reduce the voltage drop along the first conductive wire 140 when the power of the drive power source and/or the drive signal are supplied through the first conductive wire 140. For example, when the power of the first power source (ELVDD) is supplied through the first conductive wire 140, the variation in luminance between the pixels may be reduced to display an image with uniform image quality.

In designing an organic light emitting display device to reduce a dead space on a substrate, at least some wires such as the first conductive wire 140 in FIG. 1 may be so disposed to overlap the sealing agent 300. For example, the sealing agent 300 may also be disposed at an inner upper portion of the first conductive wire 140 to completely overlap the first conductive wire 140. Also, a passivation film (not shown) and the like may be formed between the second conductive layer 140b and the sealing agent 300.

However, when the first conductive wire 140 is designed as shown in FIG. 2, an adhesive force of the sealing agent 300 formed on the first conductive wire 140 may be applied non-uniformly.

That is, in the region where the contact holes 140c are concentrated, a surface area where a top layer (for example, a second conductive layer 140b) on the contact hole 140c that is in contact with the sealing agent 300 may be increased since an upper portion of the region is formed non-uniformly. Therefore, the adhesive force between the top layer on the contact holes 140c and the sealing agent 300 may be enhanced, but the adhesive force between the other regions may be relatively reduced.

Also in the region where the contact holes 140c are concentrated, it is possible to reduce the volume expansion of the region by dispersing a heat energy into the first conductive layer 140a, the heat energy being generated in a step of melting the sealing agent 300 by using a laser. On the contrary, an adhesive force at the region where the contact holes 140c are concentrated and that at the other regions may be different since the heat energy is not easily dispersed in the other regions.

Therefore, the sealing agent 300 may be peeled off from a region where the adhesive force is relatively weak. Accordingly, the reliability of the organic light emitting display device may be reduced. Therefore, according to another embodiment of the present invention, a uniform adhesive force of the sealing agent 300 is provided by employing another laminated structure of the first conductive wires 140 as shown in FIG. 4.

Figure 5A:
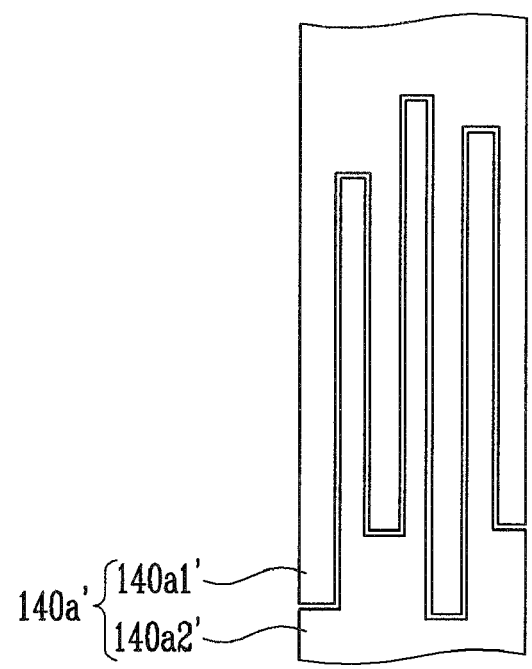
FIG. 5A is a plan view showing a first conductive layer shown in FIG. 4.
Figure 5B:
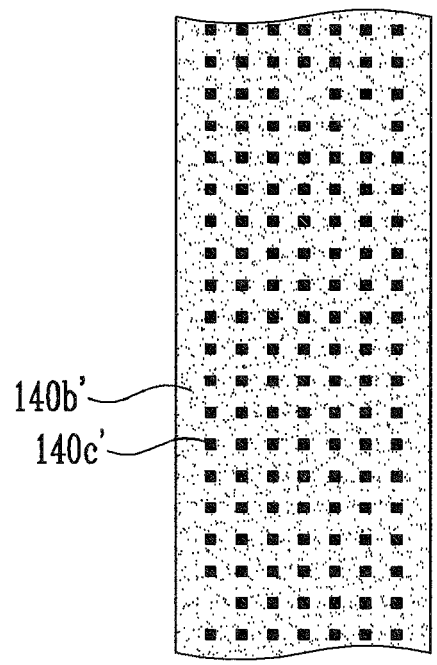
FIG. 5B is a plan view showing contact holes and a second conductive layer shown in FIG. 4.
Figure 6:
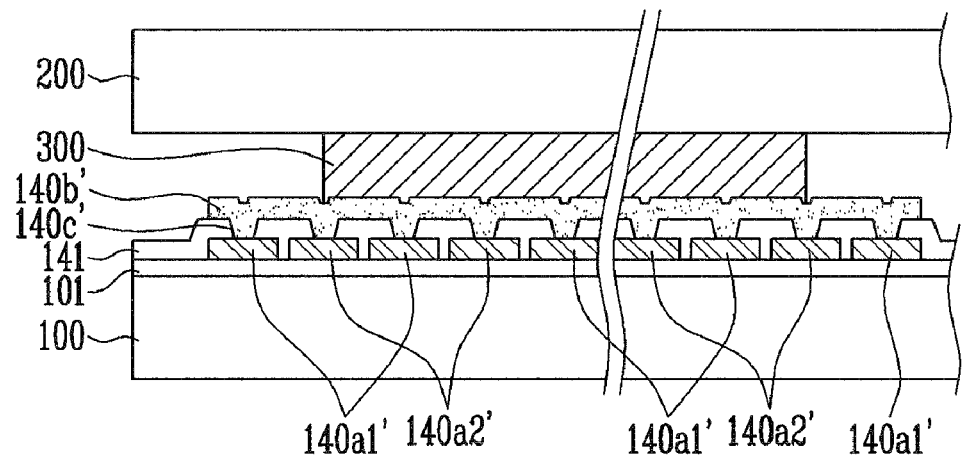
FIG. 6 is a cross-sectional view taken along the line II-II' in FIG. 4.

FIG. 4 is a plan view showing another embodiment of the first conductive wire 140 as shown in FIG. 1. FIG. 5A is a plan view showing a first conductive layer 140a' as shown in FIG. 4, and FIG. 5B is a plan view showing contact holes 140c' and a second conductive layer 140b' as shown in FIG. 4. Also, FIG. 6 is a cross-sectional view taken along the line II-II' as shown in FIG. 4. In FIGS. 4 to 6, detailed descriptions of the similar components as shown in FIGS. 2 and 3 are omitted for clarity.

Referring to FIGS. 4 to 6, at least one region 140_2 of the first conductive wire 140 is formed with a laminated structure that includes a first conductive layer 140a' and a second conductive layer 140b'.

The first conductive layer 140a' includes first and second regions 140a1' and 140a2' that are physically disconnected to be spaced apart from each other. Here, an interface between the first and second regions 140a1' and 140a2' may be formed in a concavo-convex shape (or having matching protrusions units and receiving units) when viewed from the top.

Also, the interface between the first and second regions 140a1' and 140a2' is crisscrossed so that the upper lines and the lower lines with the concavo-convex shape can form a straight line, respectively.

Therefore, it is possible to disperse the interface between the first and second regions 140a1' and 140a2' of the first conductive layer 140a' where they are physically disconnected with each other.

Also, the contact holes 140c' through which the first and second conductive layer 140a', 140b' are electrically coupled to each other are uniformly distributed over a region where the first conductive layer 140a' and the second conductive layer 140b' are overlapped with each other in this exemplary embodiment.

According to the exemplary embodiment as described above, the exemplary embodiment as shown in FIG. 4 may reduce the resistance of the first conductive wire 140 and prevent an antenna effect that may occur in the first conductive layer 140a'. Also, the sealing agent 300 may be formed with a uniform adhesive force.

According to the described embodiment, the interface between the first and second regions 140a1' and 140a2' of the first conductive layer 140a' that are physically disconnected from each other are uniformly dispersed, and the contact holes 140c' through which the first and second conductive layers 140a' and 140b' are electrically coupled to each other are also uniformly distributed. Therefore, the sealing agent 300 disposed on the first conductive wire 140 can have a more uniform adhesive force.

Although only the laminated regions 140_1 and 140_2 of the first conductive wire 140 are shown in FIGS. 2 to 6, the present invention is not particularly limited to the laminated structure of the first conductive wires 140.

In some embodiments, the first conductive wire 140 may be formed with a single layer structure. Also, while one region of the first conductive wire 140 may be formed with one of the laminated structures according to the exemplary embodiments as shown in FIGS. 2 to 6, other regions of the first conductive wire 140 may be formed with a single layer structure.

Figure 7:
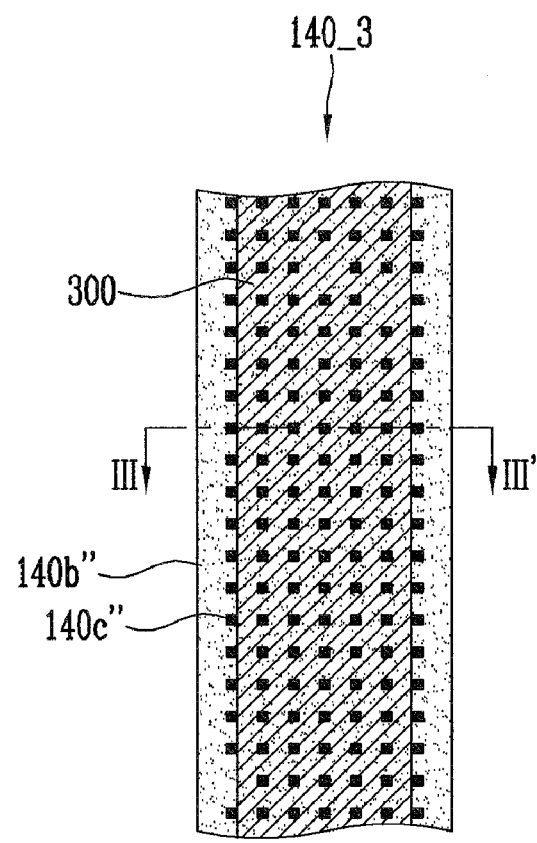
FIG. 7 is a plan view showing still another embodiment of the first conductive wire shown in FIG. 1.
Figure 8:
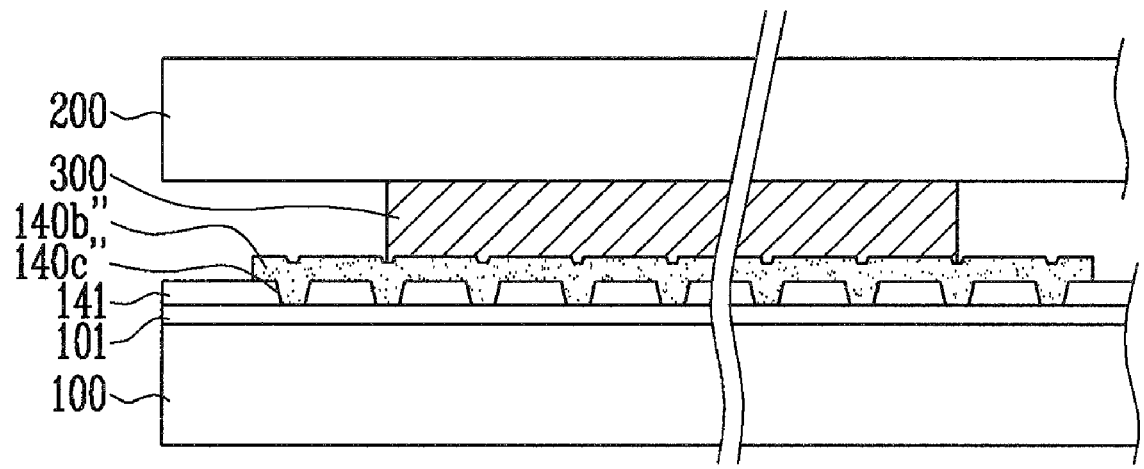
FIG. 8 is a cross-sectional view taken along the line III-III' in FIG. 7.

In another embodiment, the entire first conductive wire 140 or some regions of the first conductive wire 140 may be composed of a non-laminated region 140_3 that is composed only of a second conductive layer 140b" as shown in FIGS. 7 and 8.

In this embodiment, contact holes 140c" may be uniformly distributed in the insulating film 141 that is formed in a lower portion of the second conductive layer 140b" so that the sealing agent 300 formed on the first conductive wire 140 can have a uniform adhesive force. Another insulating film 101 such as a buffer layer and/or a gate insulating film is formed in a lower portion of the contact holes 140c", and therefore this configuration may not affect the voltage level of the first pixel power source (ELVDD) supplied to the first conductive wire 140.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device comprising:
   a first substrate having a display unit on one surface thereof;
   a second substrate overlapping with at least one region of the first substrate including the display unit;
   a sealing agent attached between the first substrate and the second substrate for sealing the display unit; and a conductive wire on the first substrate and overlapping with at least a portion of the sealing agent and comprising a first conductive layer and a second conductive layer disposed on the first conductive layer, at least one region of the first conductive layer and at least one region of the second conductive layer formed at different levels and electrically coupled to each other through contact holes, the second conductive layer comprising a continuous region, wherein the first conductive layer comprises a first region and a second region that are electrically coupled to each other through the second conductive layer and the contact holes and that are physically disconnected from each other, and an interface between the first region and the second region has a concavo-convex shape in a plane parallel to the one surface of the substrate.

2. The organic light emitting display device according to claim 1, wherein the interface between the first region and second region of the first conductive layer has first straight sections extending in a first direction and second straight sections extending in the first direction, wherein the first straight sections and the second straight sections are alternately arranged such that the first and second straight sections are not aligned with each other along the first direction, wherein the first direction is a longitudinal direction of conductive wire.

3. The organic light emitting display device according to claim 1, wherein the contact holes are uniformly distributed throughout a region where the first conductive layer and the second conductive layer overlap with each other.

4. An organic light emitting display device comprising:
a first substrate having a display unit on one surface thereof;
a second substrate overlapping with at least one region of the first substrate including the display unit;
a sealing agent attached between the first substrate and the second substrate for sealing the display unit; and
a conductive wire on the first substrate and overlapping with at least a portion of the sealing agent and comprising a first conductive layer and a second conductive layer disposed on the first conductive layer, at least one region of the first conductive layer and at least one region of the second conductive layer formed at different levels and electrically coupled to each other through contact holes,
wherein the first conductive layer comprises a first region and a second region that are physically disconnected from each other, an interface between the first region and the second region has a concavo-convex shape in a plane parallel to the one surface of the substrate, the first conductive layer comprises a gate metal, the second conductive layer comprises a source/drain metal, and a gate insulating layer is between the first conductive layer and the second conductive layer.

5. The organic light emitting display device according to claim 1, wherein the conductive wire comprises a power line for supplying power of a power source to the display unit.

6. The organic light emitting display device according to claim 1, wherein the contact holes are uniformly distributed between the first conductive layer and the second conductive layer.

7. An organic light emitting display device comprising:
a first substrate having a display unit on one surface thereof;
a second substrate overlapping with at least one region of the first substrate including the display unit;
a sealing agent attached between the first substrate and the second substrate for sealing the display unit; and
a conductive wire on the first substrate and overlapping with at least a portion of the sealing agent,
wherein the conductive wire comprises a discontinuous first conductive layer comprising a first region and a second region and having receiving portions and protrusions spaced from and received by the receiving portions in a longitudinal direction of the conductive wire, and a continuous second conductive layer on an insulating film having a plurality of contact holes formed therein, and
wherein the first region and the second region are electrically coupled to each other through the second conductive layer and the contact holes.

8. The organic light emitting display device according to claim 7, wherein the plurality of contact holes are uniformly distributed in the insulating film between the first conductive layer and the second conductive layer.

9. An organic light emitting display device comprising:
a first substrate having a display unit on one surface thereof;
a second substrate overlapping with at least one region of the first substrate including the display unit;
a sealing agent attached between the first substrate and the second substrate for sealing the display unit; and
a conductive wire on the first substrate overlapping with at least a portion of the sealing agent and comprising a first conductive layer and a second conductive layer comprising a continuous region, at least one region of the first conductive layer and at least one region of the second conductive layer formed at different levels and electrically coupled to each other through contact holes,
wherein the first conductive layer comprises a first region and a second region that are physically disconnected from each other in a longitudinal direction of the conductive wire at a first end of the first region and a second end of the second region, and that are electrically coupled to each other through the second conductive layer and the contact holes, and the first end and the second end each comprise protrusions and receiving portions.

10. The organic light emitting display device according to claim 9, wherein the receiving portions of the first end are configured to receive the protrusions of the second end, and the receiving portions of the second end are configured to receive the protrusions of the first end.

11. The organic light emitting display device according to claim 9, wherein at least one of the protrusions of the first end extends further than another one of the protrusions of the first end, and at least one of the protrusions of the second end extends further than another one of the protrusions of the second end.

12. The organic light emitting display device according to claim 9, wherein the contact holes are uniformly distributed throughout a region where the first conductive layer and the second conductive layer overlap each other.

13. The organic light emitting display device according to claim 9, wherein the contact holes are uniformly distributed between the first conductive layer and the second conductive layer.

* * * * *